United States Patent
Liang et al.

(10) Patent No.: US 7,194,799 B2
(45) Date of Patent: Mar. 27, 2007

(54) PROCESS FOR FABRICATING A HIGH DENSITY MULTI-LAYER MICROCOIL

(75) Inventors: Morris P. F. Liang, Hsinchu Hsien (TW); Sway Chuang, Hsinchu Hsien (TW); Frank K. C. Fan, Hsinchu (TW); Chen Chung Kao, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 399 days.

(21) Appl. No.: 10/827,375

(22) Filed: Apr. 20, 2004

(65) Prior Publication Data

US 2004/0196130 A1 Oct. 7, 2004

Related U.S. Application Data

(62) Division of application No. 10/200,194, filed on Jul. 23, 2002, now Pat. No. 6,876,285.

(30) Foreign Application Priority Data

May 10, 2002 (TW) ............................... 91109741 A

(51) Int. Cl.
*H01F 7/06* (2006.01)

(52) U.S. Cl. ...................... 29/606; 29/592.1; 29/602.1; 29/605; 29/846; 216/39; 216/41; 257/531; 336/65; 336/83; 336/200; 336/206; 336/220; 336/232; 438/106; 438/107; 438/238; 438/381

(58) Field of Classification Search .............. 29/592.1, 29/602.1, 605, 606, 846; 216/39, 41; 336/65, 336/83, 200, 206–208, 220–223, 232; 257/531; 438/238, 381, 106, 107

See application file for complete search history.

(56) References Cited

U.S. PATENT DOCUMENTS

| | | | |
|---|---|---|---|
| 5,576,680 A | 11/1996 | Ling | 336/200 |
| 5,852,866 A | 12/1998 | Kuettner et al. | 29/608 |
| 6,015,742 A | 1/2000 | Ju | 438/381 |
| 6,429,764 B1 * | 8/2002 | Karam et al. | 336/200 |
| 6,441,715 B1 | 8/2002 | Johnson | 336/200 |
| 6,600,404 B1 * | 7/2003 | Kajino | 336/200 |

OTHER PUBLICATIONS

"Novel Fabrication Of Electroplated 3D Micro-Coils Using 3D Photolithography Of Thick Photoresist"; Yoon, J.-B.; Han, C.-H.; Yoon, E.-S.; Kim, C.-K.; Microprocesses and Nanotechnology Conference, 1998 International; Jul. 13-16, 1998; pp. 85-86.*

* cited by examiner

*Primary Examiner*—Paul D. Kim
(74) *Attorney, Agent, or Firm*—Rabin & Berdo, P.C.

(57) ABSTRACT

A high density multi-layer microcoil includes a substrate, a multi-layer coil winding, a magnetic core and a dry film photoresist structure. The multi-layer coil winding and the magnetic core are supported by the dry film photoresist structure. The fabrication process is using photolithography process to form a dry film photoresist structure with a coil tunnel having coil elements perpendicular to the substrate and two outlets at ends of the tunnel; and injecting a conductive material with a low melting point into the tunnel and forming the coil winding.

7 Claims, 7 Drawing Sheets

PROCESS FOR FABRICATING A HIGH DENSITY MULTI-LAYER MICROCOIL

CROSS-REFERENCE TO RELATED APPLICATION

This application is a divisional of application Ser. No. 10/200,194, which was filed on Jul. 23, 2002, now U.S. Pat. No. 6,876,285.

BACKGROUND OF THE INVENTION

1. Field of the Invention

The invention generally relates to a microcoil and a fabrication process of the microcoil, and particularly relates to a high density multi-layer microcoil and a method for fabricating high density multi-layer microcoil.

2. Related Art

The market size of microcoils has become larger and larger. According to conservative market estimate of Nexus, there is a 100 million USD market on basic needs for microcoils, and hard to be estimated if including needs for further applications. The microcoils are so small that conventional coil-winding method has limitation for increasing the density. Now, by applying techniques of MEMS (micro-electro-mechanical-system), the coil size can be in a range of 0.01 to 1 inch. The MEMS is trend of microcoil development.

However, the MEMS generally utilize semi-conductor fabrication processes, which are basically for planar constructions. Therefore, a conventional microcoil is generally of a planar construction that is made by multi-layer depositions of metal and insulation layers, and through photolithography processes.

There have been successful cases of microcoil fabrications through MEMS. For example, as shown in FIG. 1, U.S. Pat. No. 5,852,866, a microcoil includes two stacked coil windings 1a, 1b formed in parellel on a substrate and connected with a through-plating 2; a magnetic core 5 enclosed by a top part 6, a bottom part 8, a surrounding magnetic core area 7 and an insulator 4. Ends of the coil windings 1a, 1b are linked to contact points 3 for use. However, the aforesaid microcoil is a planar construction in which the coil is perpendicular to the substrate that will induce current on the substrate (especially silicon substrate) and waste energy and lower the quality. Therefore, this microcoil is not applicable for high frequency circuits. Moreover, since the axis of the coil winding is perpendicular to the plane of substrate, the coil is hard to be extended in the axial direction. Therefore, it is limited for the number of winding, or the process for multi-layer will be very complicated.

Therefore, this is a requirement for us to acquire a microcoil construction that is parallel to the substrate to avoid current induction, and suitable for high frequency circuit applications.

SUMMARY OF THE INVENTION

The object of the invention is to provide a high density multi-layer microcoil and a method for fabricating high density multi-layer microcoil. The coil winding is perpendicular to the substrate so that the magnetic field is parallel to the substrate and will not generate induction current on the substrate.

A high density multi-layer microcoil according to the invention includes a substrate, a multi-layer coil winding and a magnetic core. The multi-layer coil winding is composed of a plurality of coil element layers linking one another. Each coil element is further composed of N windings in a plane. Two ends of the coil layers are contact points for outer circuits. The coil elements are perpendicular to the substrate. The whole construction is supported by a dry film photoresist. The coil elements are made of conductive material with low melting point. The photoresist is chosen from high strength materials.

In the fabrication process, the times of optical exposure are determined by the winding number of each coil element. For a coil element with N windings, the windings are numbered as 1 to N from the inner to the outer. Each coil winding is composed of a top parallel portion, a bottom parallel portion and two vertical portions and formed as a planar coil element perpendicular to the substrate. The photoresist structure for supporting the multi-layer coil winding is made by 4N+1 times of deposition. The steps are:

a) In 1 to 2N depositions of photoresist material, using photolithography process to form the lower half portions of the 1 to N windings of the coil elements. The lower haft portions include the bottom parallel portions and lower halves of vertical portions;

b) In 2N+1 to 4N depositions of photoresist material, using photolithography process to form the upper half portions of the N to 1 windings of the coil elements. The upper haft portions include upper halves of vertical portions and the top parallel portions; and c) In the last (4N+1) deposition, using photolithography process to form a top of the photoresist structure.

Between the step a) and step b), a magnetic core can be made between the lower and the upper portions if needed. In practice, the process is designed for fewest steps. In the first planning stage, the number of layers, the number of windings for each coil element, the left or right-hand direction of coil winding, and top or bottom position of the starting point are all to be considered.

BRIEF DESCRIPTION OF THE DRAWINGS

The invention will become more fully understood from the detailed description given hereinbelow. However, this description is for purposes of illustration only, and thus is not limitative of the invention, wherein.

DETAILED DESCRIPTION OF THE INVENTION

Figure 1:
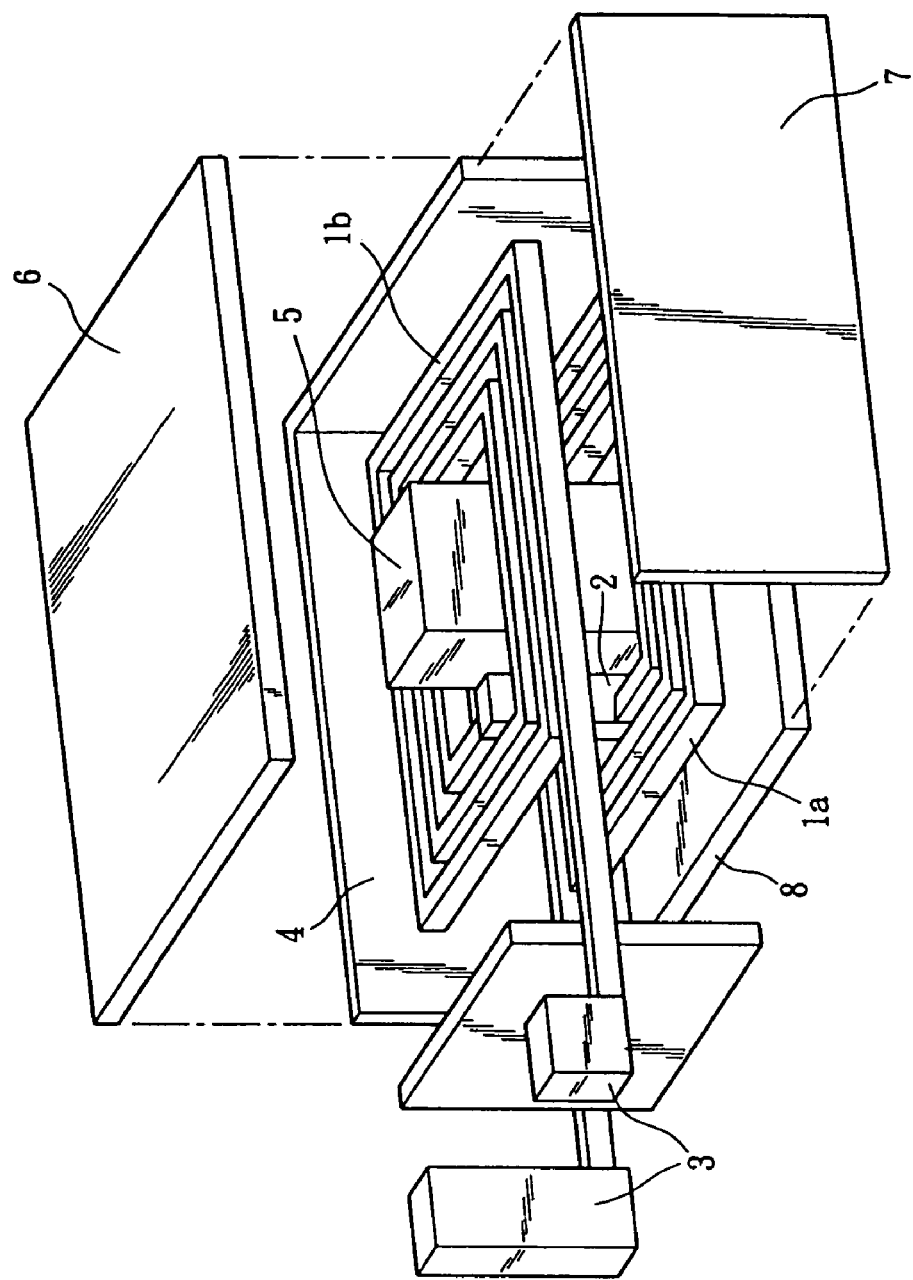
FIG. 1 is a constructional view of a microcoil of prior arts.
Figure 2:
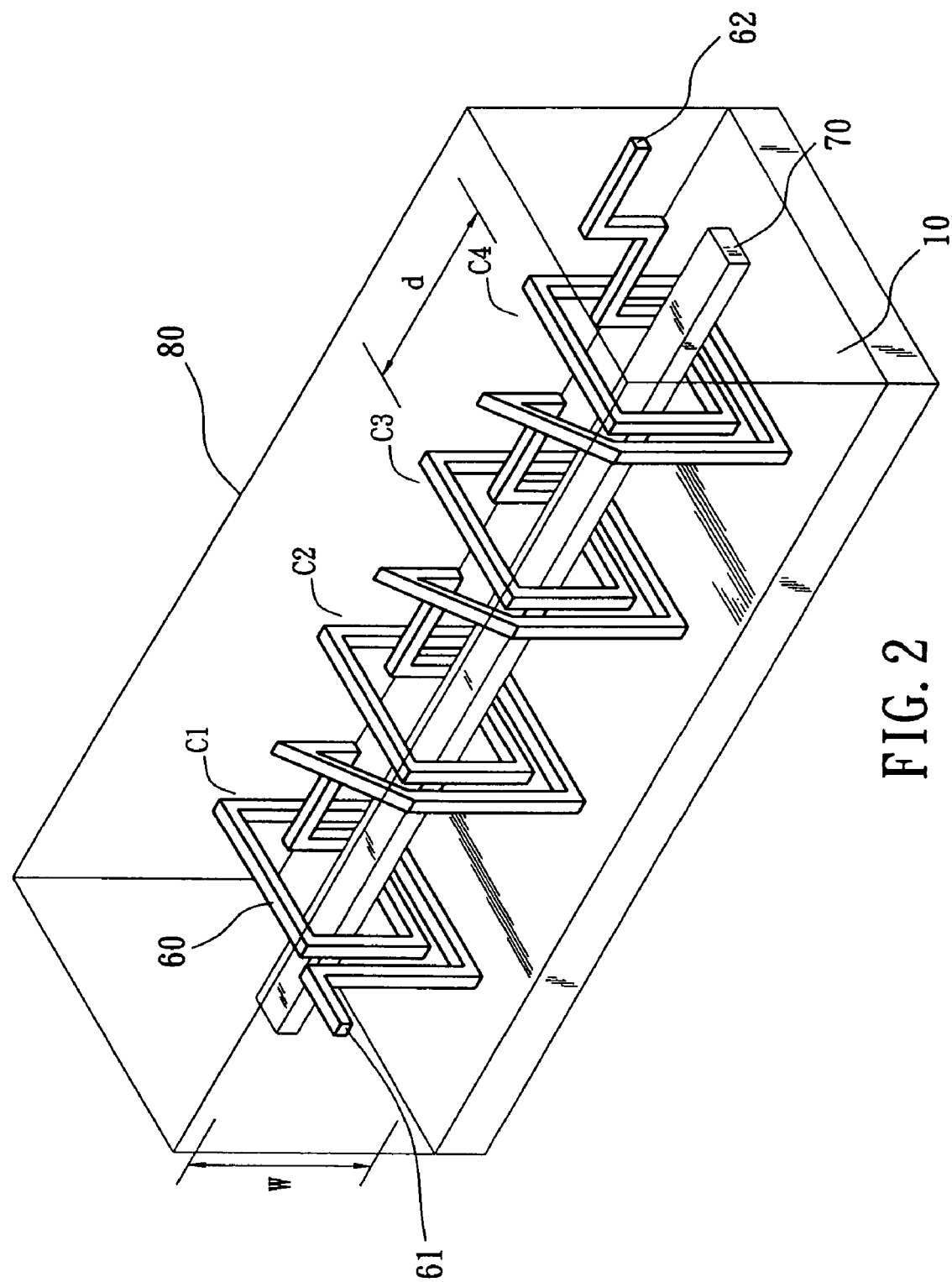
FIG. 2 is a constructional view of a microcoil of the invention.

As shown in FIG. 2, a high density multi-layer microcoil according to the invention includes a substrate 10, a multi-layer coil winding 60, a magnetic core 70 and an photoresist structure 80. The multi-layer coil winding 60 is composed of a plurality of coil element layers, e.g., C1, C2, C3 and C4, linking one another. Each coil element C1, C2, C3 or C4 is further composed of N windings in a plane. Two ends 61, 62 of the coil layers C1, C4 are contact points for outer circuits. The coil elements C1, C2, C3, C4 are perpendicular to the substrate 10 and linked sequentially to form the continuous coil winding 60. Because the coil winding 60 is perpendicular to the substrate 10, the magnetic field is parallel to the substrate and will not generate induction current to the substrate as prior arts do.

Because the coil winding 60 and the magnetic core 70 are all suspended from the substrate 10, they have to be supported by a suitable structure. The invention uses a dry film of photoresist 80 for this purpose. The photoresist structure 80 encloses the coil winding 60 and the magnetic core 70. The structure 80 provides a tunnel to hold the coil winding 60 and two openings for the end points 61, 62 to come out. The photoresist structure 80 also supports the magnetic core 70 in the axis of the coil winding 60 for increasing inductance of the coil winding 60. If a higher inductance is not necessary, then the magnetic core 70 can be omitted, and the structure is simpler.

Since the high density multi-layer microcoil of the invention is a tridimensional structure, the fabrication process has to be specially designed in order to utilize general planar fabrication process. An applicable method is first to form a dry film of photoresist structure 80 with a coil tunnel. Then, the photoresist is removed from the tunnel by a photo-developing process and an empty tunnel is formed. Finally, a conductive material with low melting point injecting into the tunnel and the coil winding 60 is formed. The magnetic core 70 is also formed during the process of forming the photoresist structure 80. As shown in FIG. 2, since the magnetic core 70 is located in the axis (central line) of the coil winding 60, it can be made when a half of the photoresist structure 80 is finished. While, if the magnetic core 70 is not needed, the process for the magnetic core 70 can be omitted.

Figure 3B:
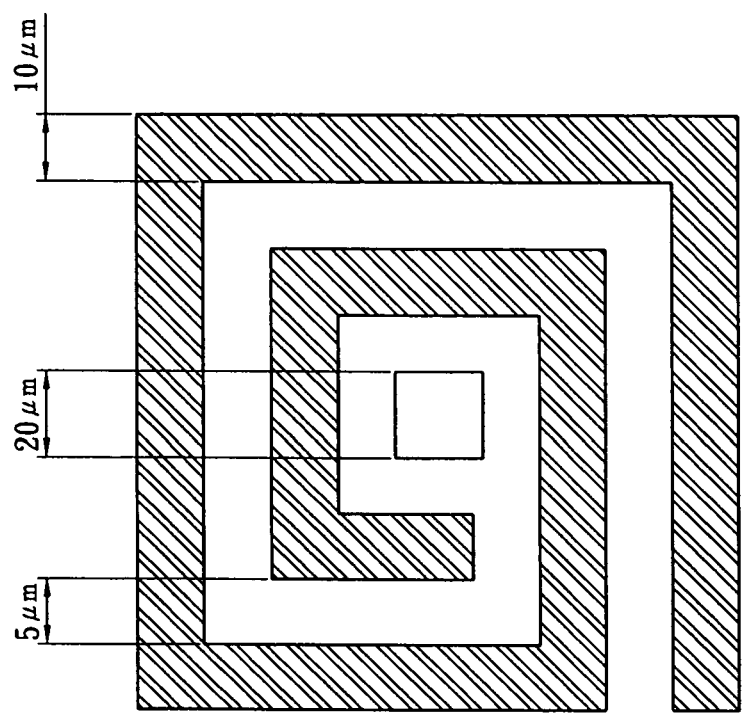
FIG. 3B is a sectional side view of an embodiment of a microcoil according to the invention.
Figure 3A:
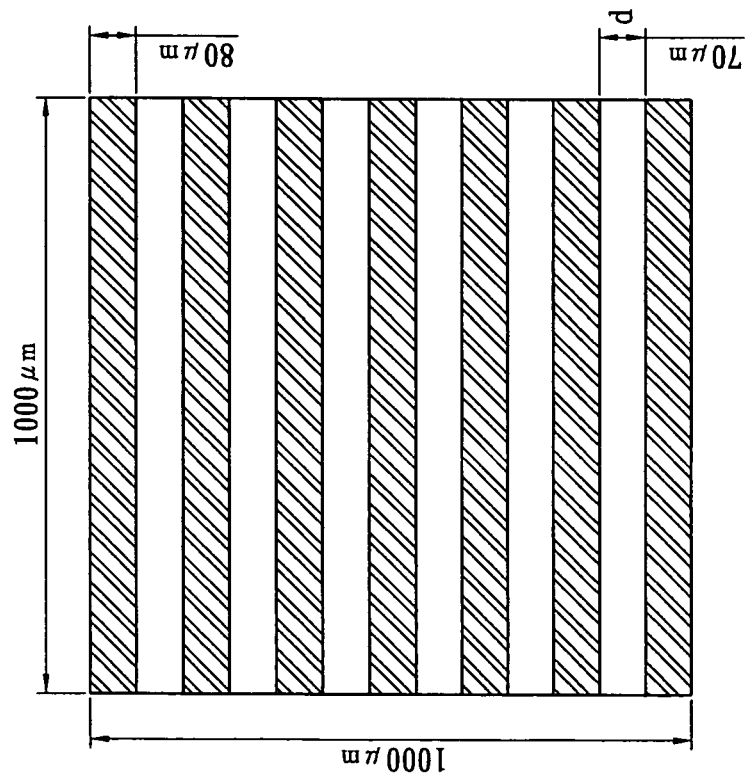
FIG. 3A is a sectional plane view of an embodiment of a microcoil according to the invention.

Before starting the fabrication process, the number of layers of the coil winding 60 and the number of windings of each coil element have to be planned. As shown in FIGS. 3A and 3B, an example of a multi-layer microcoil is made with 7 coil layers in which each coil element layer is formed with two windings. Some dimensions are also illustrated for reference. The constructional process for the photoresist structure 80 will be more complicated if more windings are needed. The process is first to form the lower half portion of the photoresist structure 80 that includes a lower half tunnel of the multi-layer microcoil 60. Secondly, the magnetic core 70 is placed. Thirdly, the upper half portion of the photoresist structure 80 that includes an upper half tunnel of the multi-layer microcoil 60 is formed. The links among the coil element layers is made on the upper half portion of the photoresist structure 80, as shown in FIG. 2, or on the lower upper half portion of the photoresist structure 80 if suitable. Through the aforesaid process, a continuos tunnel for the multi-layer microcoil 60 and a magnetic core 70 in the axis of the coil winding are made. When the magnetic core 70 is not needed, a process for the core is then omitted.

In the process, the photoresist is chosen from high strength materials, such as SU-8, which is a negative photoresist capable of forming a thick film. The pressure strength of SU-8 is around 60 thousand pounds per square inch and suitable for enduring high-pressure injection of coil material. The coil material is chosen from conductive alloys with low melting point of lead and tin. The material for the magnetic core is chosen from high magnetic permeability materials, such as supermalloy, which is composed of 79% nickel, 15% iron, 5% molybdenum and 0.5% manganese; high magnetic permeability alloy (78.5% nickel and 21.5% iron); iron and cobalt alloy, pure (99.96%) iron or silicon steel.

An embodiment of the fabrication process will be described below with reference to FIGS. 4A to 4V, which are sequential drawings corresponding to the steps for making a microcoil of FIG. 3B.

The fabrication process mainly includes steps of forming the lower half portion of photoresist structure, forming the magnetic core and forming the upper half portion of photoresist structure.

Figure 4A:
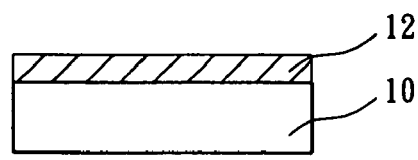
FIGS. 4A to 4V are sequential sectional views corresponding to fabrication steps of process for making a microcoil of FIG. 3B.
Figure 4B:
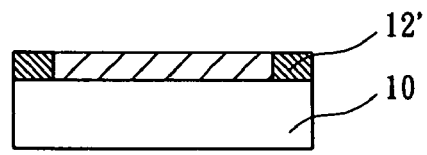
Figure 4C:
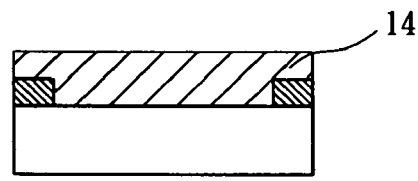
Figure 4D:
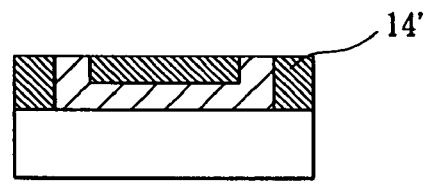
Figure 4E:
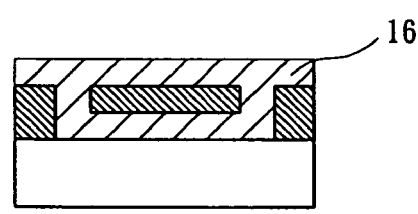
Figure 4F:
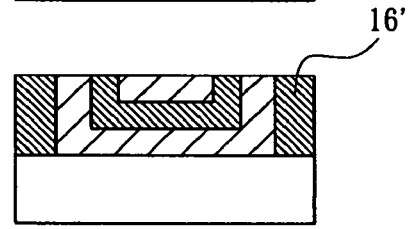
Figure 4G:
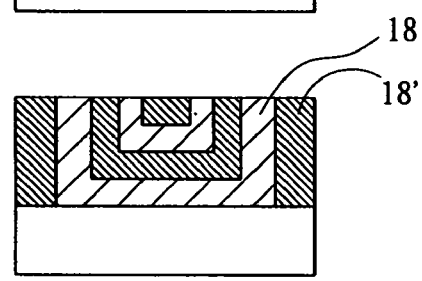

The process steps of forming the lower half portion of photoresist structure are illustrated in FIGS. 4A to 4G. In FIG. 4A, a photoresist layer 12 is first deposited on the substrate 10. Then, in FIG. 4B, a dry film photoresist 12' is formed by photolithography process. In FIG. 4C, a photoresist layer 14 is further deposited. And, in FIG. 4D, a dry film photoresist 14' is formed by photolithography process. Again, in FIG. 4E, a photoresist layer 16 is deposited, and in FIG. 4F, a dry film photoresist 16' is formed. And finally, in FIG. 4G, a photoresist layer 18 is deposited, and a dry film photoresist 18' is formed. Thus, the lower half dry film photoresist structure is finished. The tunnel for the coil winding is still filled with original photoresist material.

Figure 4H:
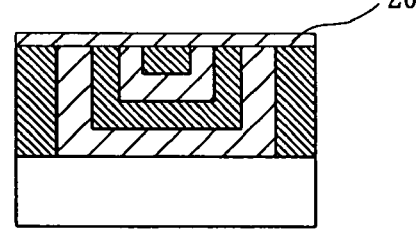
Figure 4I:
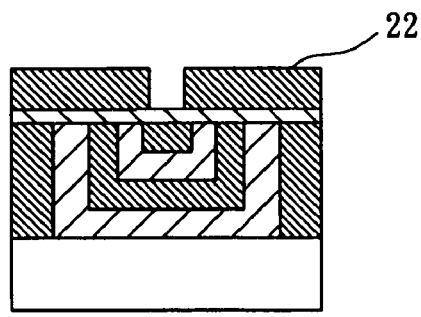
Figure 4J:
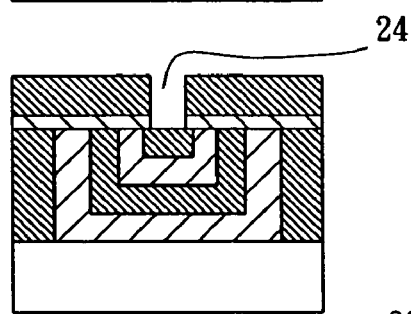
Figure 4K:
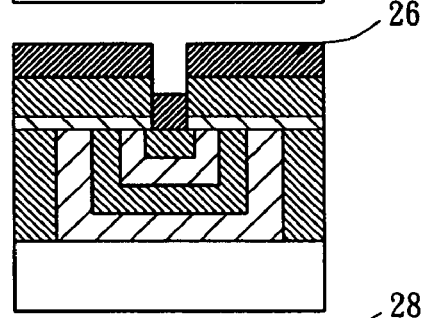
Figure 4L:
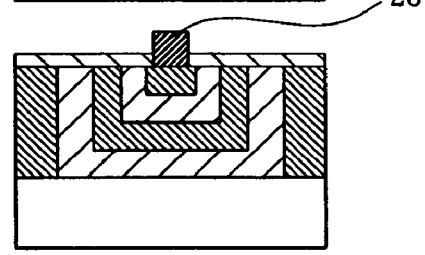
Figure 4M:
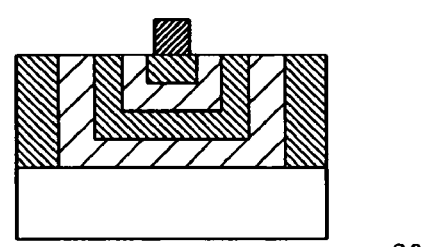

Now, for the steps of forming magnetic core, an insulation layer 20 is first deposited as shown in FIG. 4H. Then, in FIG. 4I, a photoresist layer 22 is deposited, and a dry film photoresist is formed leaving a space for the magnetic core. Then, in FIG. 4J, a portion of the insulation layer 20 is etched and removed, and an opening 24 under the space for the magnetic core is generated. In FIG. 4K, a layer 26 of high magnetic permeability material is deposited. Then, in FIG. 4L, excessive high magnetic permeability material besides the magnetic core is removed, and finally, in FIG. 4M, the insulation layer 20 is removed to finish the magnetic core 28. The material of the insulation layer 20 is chosen from silicon dioxide ($SiO_2$) or silicon nitride ($Si_3N_4$).

Figure 4N:
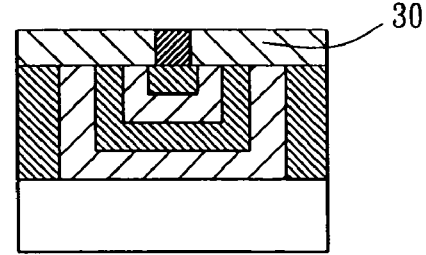
Figure 4O:
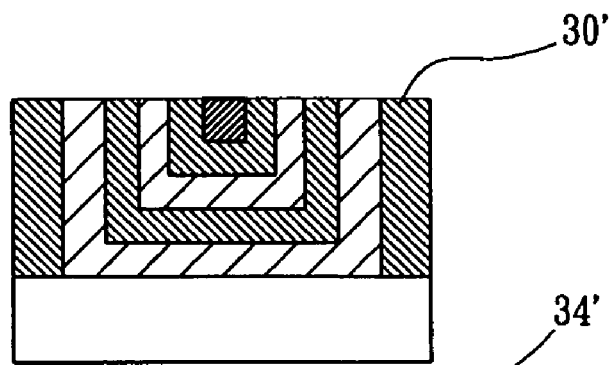
Figure 4P:
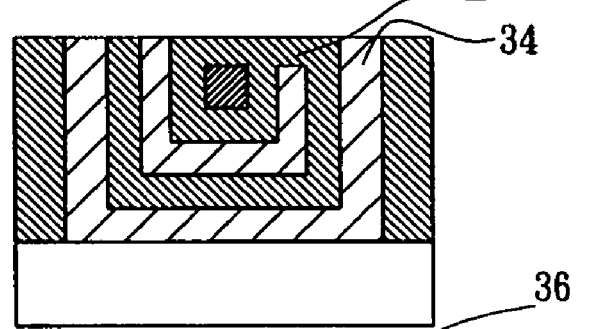
Figure 4Q:
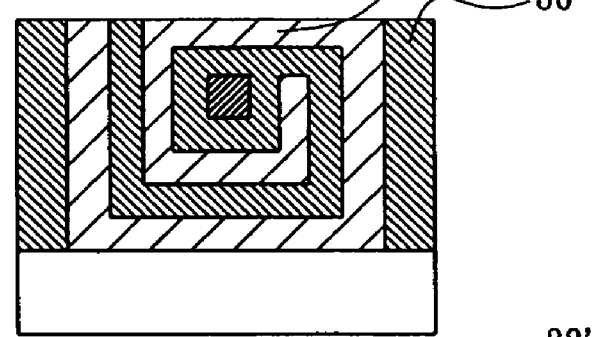
Figure 4R:
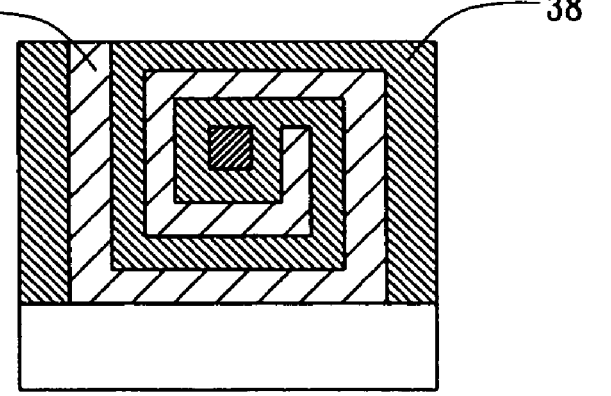
Figure 4S:
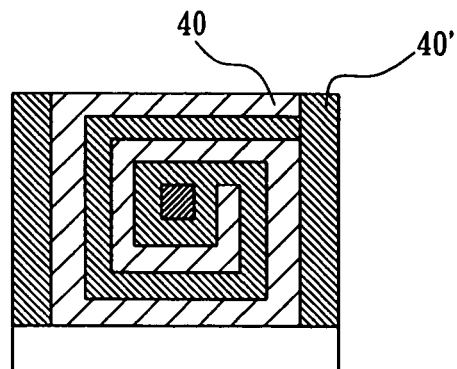
Figure 4T:
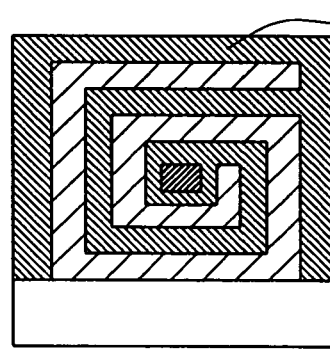

The process steps of forming the upper half portion of photoresist structure are illustrated in FIGS. 4N to 4V. In FIG. 4N, a photoresist layer 30 is first deposited on the substrate 10. Then, in FIG. 4O, a dry film photoresist 30' is formed by photolithography process. In FIG. 4P, a photoresist layer 34 is deposited and a dry film photoresist 34' is formed. Again, in FIG. 4Q, a photoresist layer 36 is deposited and a dry film photoresist 36' is formed. Further, in FIG. 4R, a photoresist layer 38 is deposited and a dry film photoresist 38' is formed. In FIG. 4S, a photoresist layer 40 is deposited and a dry film photoresist 40' is formed. And finally, in FIG. 4T, a photoresist layer is deposited and a top dry film photoresist is formed. Thus, the whole dry film photoresist structure is finished. The tunnel for the coil winding is filled with original photoresist material.

Also, during some steps of forming the portions of the coil winding, each inner end of a coil element has to link with an outer end of an adjacent coil element. The connection tunnels are formed synchronously during the aforesaid steps.

Figure 4U:
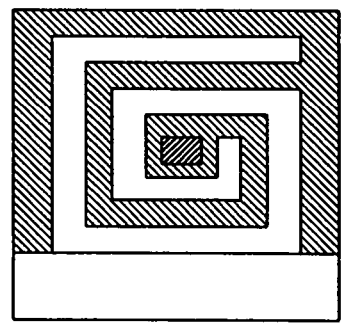

After the forming the windings is finished, the photoresist material is removed. As shown in FIG. 4U, the tunnel for the coil winding is cleared. To clear the tunnel, some developing liquid is injected through the openings, i.e., the end points 61, 62 of the coil winding as shown in FIG. 2. The process is slow. After the tunnel is cleared, a conductive alloy with low melting point is injected into the tunnel to form the coil winding, as shown in FIG. 4V.

Figure 4V:
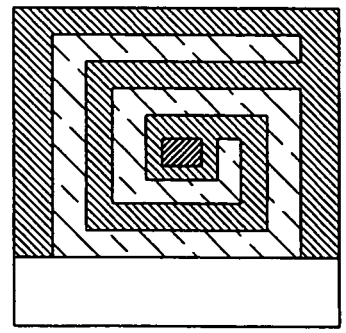

A summary of the fabrication process can be made from the aforesaid example of FIGS. 4A to 4V. For a coil element with N windings, the windings are numbered as 1 to N from inner to outer. Each coil winding is composed of a top parallel portion, a bottom parallel portion and two vertical portions and formed as a planar coil element perpendicular to the substrate. The photoresist structure for supporting the multi-layer coil winding is made by 4N+1 times of deposition. The steps are:

a) In 1 to 2N depositions of photoresist material, using photolithography process to form the lower half portions of the 1 to N windings of the coil elements. The lower half portions include the bottom parallel portions and lower halves of vertical portions;

b) In 2N+1 to 4N depositions of photoresist material, using photolithography process to form the upper half portions of the N to 1 windings of the coil elements. The upper half portions include upper halves of vertical portions and the top parallel portions; and c) In the last (4N+1) deposition; using photolithography process to form a top of the photoresist structure.

During aforesaid steps a) and b), some steps for making a magnetic core can be added. However, if the magnetic core is not needed, the steps are then omitted.

In practice, the process is designed for fewest steps. In the first planning stage, the number of layers, the number of windings for each coil element, the left or right-hand direction of coil winding, and top or bottom position of the starting point are all to be considered.

With the process of the invention, a high density multi-layer microcoil can be obtained. The number of coil winding is determined by multiplication of the layers of the coil and the windings in each coil element, which is therefore not limited in contrast to prior arts. Further, the fabrication process can be carried out just by conventional photolithography and etching process.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for fabricating a high density multi-layer microcoil comprising steps of:

providing a substrate;

using photolithography process to form a dry film photoresist structure with a coil tunnel having coil elements perpendicular to said substrate and two outlets at ends of said tunnel; and injecting a conductive material with low melting point into said tunnel and forming a coil winding, wherein said steps of forming said photoresist structure depend on number of windings in each coil element; for a coil element with N windings, said windings are numbered as 1 to N from inner to outer; each coil is winding is composed of a top parallel portion, a bottom parallel portion and two vertical portions and formed as a planar coil element perpendicular to said substrate; said photoresist structure is made by 4N+1 times of deposition, comprising steps of:

depositing first to 2Nth photoresist materials, using photolithography to form said lower half portions of said 1 to N windings of said coil elements; said lower haft portions comprises bottom parallel portions and lower halves of vertical portions;

depositing 2N+1 to 4Nth photoresist materials, using photolithography process to form said upper half portions of said N to 1 windings of said coil elements; said upper haft portions comprises upper halves of vertical portions and top parallel portions; and depositing last (4N+1) photoresist material, using photolithography to form a top of said photoresist structure.

2. The process for fabricating a high density multi-layer microcoil according to claim 1, wherein said dry film photoresist is chosen from high strength materials.

3. A process for fabricating a high density multi-layer microcoil comprising steps of:

providing a substrate;

using photolithography process to form a dry film photoresist structure for a lower half coil tunnel;

depositing an insulation layer on top of said lower half coil tunnel;

using photolithography process to form a magnetic core on said insulation layer and in center portion of said photoresist structure;

removing said insulation layer;

using photolithography process to form a dry film photoresist structure for an upper half coil tunnel, which covers said magnetic core, and forms a coil tunnel having coil elements perpendicular to said substrate and two outlets at ends of said tunnel; and injecting a conductive material with low melting point into said tunnel and forming a coil winding.

4. The process for fabricating a high density multi-layer microcoil according to claim 3 wherein said steps of forming said photoresist structure of lower and upper half coil tunnels depend on number of windings in each coil element; for a coil element with N windings, said windings are numbered as 1 to N from inner to outer; each coil winding is composed of a top parallel portion, a bottom parallel portion and two vertical portions and formed as a planar coil element perpendicular to said substrate; said photoresist structure is made by 4N+1 times of deposition, comprising steps of:

depositing first to 2Nth photoresist materials, using photolithography to form said lower half portions of said 1 to N windings of said coil elements; said lower haft portions comprises bottom parallel portions and lower halves of vertical portions;

depositing 2N+1 to 4Nth photoresist materials, using photolithography process to form said upper half portions of said N to 1 windings of said coil elements; said upper haft portions comprises upper halves of vertical portions and top parallel portions; and depositing last (4N+1) photoresist material, using photolithography to form a top of said photoresist structure.

5. The process for fabricating a high density multi-layer microcoil according to claim 4 wherein said dry film photoresist is chosen from high strength materials.

6. The process for fabricating a high density multi-layer microcoil according to claim 3 wherein said magnetic core is made of high magnetic permeability materials.

7. The process for fabricating a high density multi-layer microcoil according to claim 3 wherein said magnetic core is made of materials chosen from silicon dioxide and silicon nitride.

* * * * *